United States Patent
Unnikrishnan et al.

(10) Patent No.: US 10,381,651 B2
(45) Date of Patent: Aug. 13, 2019

(54) DEVICE AND METHOD OF MANUFACTURING HIGH-ASPECT RATIO STRUCTURES

(71) Applicants: Nederlandse Organisatie voor toegepast-natuurwetenschappelijk onderzoek TNO, s-Gravenhage (NL); IMEC vzw, Leuven (BE)

(72) Inventors: Sandeep Unnikrishnan, s-Gravenhage (NL); Philippe Vereecken, Leuven (BE)

(73) Assignees: Nederlandse Organisatie voor toegepast-natuurwetenschappelijk onderzoek TNO, 's-Gravenhage (NL); IMEC vzw, Leuven (BE)

(*) Notice: Subject to any disclaimer, the term of this patent is extended or adjusted under 35 U.S.C. 154(b) by 285 days.

(21) Appl. No.: 15/120,232

(22) PCT Filed: Feb. 20, 2015

(86) PCT No.: PCT/NL2015/050107
§ 371 (c)(1),
(2) Date: Aug. 19, 2016

(87) PCT Pub. No.: WO2015/126248
PCT Pub. Date: Aug. 27, 2015

(65) Prior Publication Data
US 2017/0062834 A1    Mar. 2, 2017

(30) Foreign Application Priority Data

Feb. 21, 2014  (EP) ..................... 14156170
Feb. 21, 2014  (EP) ..................... 14156208

(Continued)

(51) Int. Cl.
H01M 4/70 (2006.01)
H01M 4/04 (2006.01)
(Continued)

(52) U.S. Cl.
CPC .......... H01M 4/70 (2013.01); H01M 4/0442 (2013.01); H01M 4/661 (2013.01); H01M 6/40 (2013.01);
(Continued)

(58) Field of Classification Search
CPC ............... H01M 4/70; H01M 10/0525; H01M 10/0585; H01M 4/0442; H01M 4/661;
(Continued)

(56) References Cited

U.S. PATENT DOCUMENTS

2002/0118027 A1  8/2002  Routkevitch et al.
2005/0098205 A1  5/2005  Roscheisen et al.
(Continued)

FOREIGN PATENT DOCUMENTS

CN    102263244 A    11/2011
WO    2007027197 A2   3/2007
(Continued)

OTHER PUBLICATIONS

Apr. 14, 2015—International Search Report and Written Opinion of PCT/NL2015/050107.

*Primary Examiner* — Wojciech Haske
(74) *Attorney, Agent, or Firm* — Banner & Witcoff, Ltd.

(57) ABSTRACT

An method for manufacturing a electronic device is provided having a current collector capable of a high specific charge collecting area and power, but is also achieved using a simple and fast technique and resulting in a robust design that may be flexed and can be manufactured in large scale processing. To this end the electronic device comprising an electronic circuit equipped with a current collector formed (Continued)

by a metal substrate having a face forming a high-aspect ratio structure of pillars having an interdistance larger than 600 nm. By forming the high-aspect structure in a metal substrate, new structures can be formed that are conformal to curvature of a macroform or that can be coiled or wound and have a robust design.

20 Claims, 7 Drawing Sheets

(30) Foreign Application Priority Data

Apr. 4, 2014 (EP) .................................... 14163546
Apr. 4, 2014 (EP) .................................... 14163570

(51) Int. Cl.
| | |
|---|---|
| *H01M 4/66* | (2006.01) |
| *H01M 10/04* | (2006.01) |
| *H01M 10/0562* | (2010.01) |
| *H01M 10/0585* | (2010.01) |
| *H01M 6/40* | (2006.01) |
| *H01M 10/0525* | (2010.01) |
| *H01G 9/20* | (2006.01) |
| *H01M 10/052* | (2010.01) |
| *H01L 31/0224* | (2006.01) |

(52) U.S. Cl.
CPC ... *H01M 10/0436* (2013.01); *H01M 10/0525* (2013.01); *H01M 10/0562* (2013.01); *H01M 10/0585* (2013.01); *H01G 9/20* (2013.01); *H01L 31/022425* (2013.01); *H01M 4/045* (2013.01); *H01M 4/0423* (2013.01); *H01M 4/0428* (2013.01); *H01M 10/052* (2013.01); *Y02E 10/52* (2013.01); *Y02E 60/122* (2013.01); *Y02P 70/54* (2015.11)

(58) Field of Classification Search
CPC ......... H01M 10/0436; H01M 10/0562; H01M 6/40; Y02P 70/54
See application file for complete search history.

(56) References Cited

U.S. PATENT DOCUMENTS

| | | |
|---|---|---|
| 2006/0216603 A1 | 9/2006 | Choi |
| 2007/0052119 A1 | 3/2007 | Sakai et al. |
| 2007/0059584 A1 | 3/2007 | Nakano et al. |
| 2009/0039777 A1 | 2/2009 | Oda |
| 2009/0042102 A1 | 2/2009 | Cui et al. |
| 2009/0214956 A1 | 8/2009 | Prieto et al. |
| 2010/0167111 A1 | 7/2010 | Sumihara et al. |
| 2010/0304204 A1* | 12/2010 | Routkevitch ........... C01B 3/042 429/122 |
| 2011/0111304 A1 | 5/2011 | Cui et al. |
| 2011/0117417 A1 | 5/2011 | Pitts |
| 2011/0129732 A1* | 6/2011 | Bachrach .............. H01M 4/134 429/220 |
| 2012/0094192 A1 | 4/2012 | Qu et al. |
| 2012/0164529 A1 | 6/2012 | Bahr et al. |
| 2012/0183732 A1 | 7/2012 | Hedler et al. |
| 2013/0017453 A1 | 1/2013 | Ajayan et al. |
| 2013/0189576 A1 | 7/2013 | Verbrugge et al. |
| 2013/0236781 A1 | 9/2013 | Oguni et al. |

FOREIGN PATENT DOCUMENTS

| | | |
|---|---|---|
| WO | 2008030215 A2 | 3/2008 |
| WO | 2008059936 A1 | 5/2008 |
| WO | 2008127811 A2 | 10/2008 |
| WO | 2009038897 A2 | 3/2009 |
| WO | 2009105773 A2 | 8/2009 |
| WO | 201032159 A1 | 3/2010 |
| WO | 2011015174 A1 | 2/2011 |
| WO | 2011039070 A2 | 4/2011 |
| WO | 2011060017 A2 | 5/2011 |
| WO | 2011060023 A2 | 5/2011 |
| WO | 2011066818 A1 | 6/2011 |
| WO | 2011072255 A1 | 6/2011 |
| WO | 2011094642 A1 | 8/2011 |
| WO | 2012051482 A2 | 4/2012 |
| WO | 2012105901 A1 | 8/2012 |
| WO | 2013019489 A1 | 2/2013 |
| WO | 2013026892 A1 | 2/2013 |

* cited by examiner

DEVICE AND METHOD OF MANUFACTURING HIGH-ASPECT RATIO STRUCTURES

CROSS-REFERENCE TO RELATED APPLICATIONS

This application is a U.S. National Stage application under 35 U.S.C. § 371 of International Application PCT/NL2015/050107 (published as WO 2015/126248 A1), filed Feb. 20, 2015, which claims the benefit of priority to the following applications: EP 14156208.2, filed Feb. 21, 2014; EP 14156170.4, filed Feb. 21, 2014; EP 14163546.6, filed Apr. 4, 2014; and EP 14163570.6, filed Apr. 4, 2014. Benefit of the filing date of each of these prior applications is hereby claimed. Each of these prior applications is hereby incorporated by reference in its entirety.

FIELD

The present invention relates to a method of manufacturing high-aspect ratio structures. The invention further relates to high-aspect ratio structures manufactured by the method in particular, to an electronic device comprising an electronic circuit equipped with a current collector of a type such as electrochemical or electro-optical devices.

BACKGROUND

In electronic devices electronic circuits may be equipped with current collectors of a type such as in electrochemical or electro-optical devices. For example an electrochemical device is a battery such as a rechargeable Li-ion solid-state battery having current collector of non-planar design. Another example of an electro-optical device is a light collector wherein current from a photovoltaic reaction is collected in a 3D electrode. Batteries are electrochemical cells which store and supply electrical energy as a product of a chemical reaction or conversely, light is generated.

Thin-film battery structures of known type are disclosed e.g. in WO2010032159, the contents of which are included by reference, wherein for example all-solid state compositions are deposited on 3D micro-patterned structures. In this respect, where early battery structures utilize liquid electrolytes, all-solid state compositions utilize electrolytes of a solid state type, which are inherently safer in use. In these structures a large variety of materials are and have been used for the respective electrodes for example as disclosed in US 20110117417. In discharging battery mode, the anode is the "negative electrode" to which the positive current flows, from the cathode, being the "positive electrode". During charge these functions are reversed. Irrespective charging mode, the electrochemical relationship may be characterized by charge exchange between a negative electrode material and a positive electrode material, the negative electrode material having a workfunction or redox potential that is lower than the workfunction or redox potential of the positive electrode material.

For example, known negative electrode (anode) materials are Li4Ti6O12 (Titanate); LiC6 (Graphite); Li4.4 Si (Silicon) and Li4.4Ge (Germanium) known positive electrode (cathode) materials are LiCOO2 (LCO), LiCoPO4, (doped) LiMn2O4 (LMO), LiMnPO4, LiFePO4 (LFP), LiFePO4F (LFPF) or LiCO1/3Ni1/3Mn1/3O2 (LCNMO).

Known (solid state) electrolytes might include lithium iodide (LiI), lithium phosphate (Li3PO4) and lithium phosphorus oxynitride (LiPON). In addition, lithium salts, such as LiPF6, LiBF4 or LiClO4 in an organic solvent, such as ethylene carbonate, dimethyl carbonate, diethyl carbonate, propylene carbonate are known to have a typical conductivity of about 10 mS/cm at RT. The solvent decomposes on initial charging and forms a solid layer called the solid electrolyte interphase (SEI).

Solid polymer separators may also be included, such polymers having transport capacity often due to having a lithium salt disposed therein as known in the state of the art. Work has also been performed with lithium and halide materials, particularly, in some examples, a lithium aluminum tetrahalide such as lithium aluminum tetrafluoride (LiAlF4).

Similarly, in a photovoltaic device, a conformal functional coating may be provided on the current collector, that aids in conversion of light to electric power or vice versa.

In the referenced type, a high specific surface area of current collector structures i.e. electrodes enable high currents to be drawn from these batteries. Moreover, they also will enable quick charging of these batteries. In the known device high-aspect ratio structures such as pillars, trenches or holes are etched in a silicon wafer. In order to make the fabrication of these batteries cost-effective, a desire exists to produce these on cheaper substrates (e.g. metal/plastic foils) with a cheaper large-area process.

Once such structures are made on a bendable metal foil, they can be manufactured in large-scale processes, e.g. a roll-to-roll process where the following can be done: 1) Coiling, winding or stacking it to increase the energy or power density per unit volume. 2) Integrating it on flexible devices like flexible displays, signage etc.

Although, high-aspect ratio structures can be made in nanometer scale the height or depth of these high-aspect ratio structures need to be in the microns range for delivering enough charge capacity for the battery. The reason pillar structures are preferred is due to the easy accessibility of their entire surface when compared to porous or perforated structures of similar aspect ratio and dimensions. In the prior art many methods to produce these are non-economical (e.g. involving silicon microfabrication and long-time electrodeposition). Moreover, to do any of these, the design of the stack is in need for optimization because otherwise while winding or flexing, the pillar structure could be damaged inhibiting proper electrochemical action of the device.

A need still exists to produce these high-aspect ratio structures in a simple and reliable way.

SUMMARY OF THE INVENTION

It is an object of the invention to provide a method for producing an electronic device having a current collector capable of a high specific charge collecting area and power, but is also achieved using a simple and fast technique and resulting in a robust design that may optionally be flexed.

To this end, according to an aspect a method is provided for manufacturing a current collector with a high-aspect ratio structure of pillars formed in a metal substrate, wherein the method comprises: form elongate nanopore structures on a face thereof; masking the anodized metal face with a micro-pattern mask arranged to forming the pillars having a minimum interdistance larger than 600 nm; and rendering the pillars electrically conductive. In particular, the electronic device manufactures in this way comprising an electronic circuit equipped with a current collector formed by a monolithic metal substrate having a face forming a high-aspect ratio structure of pillars having a minimum interdistance that is larger than 600 nm. By forming the high-aspect structure in a metal substrate, new structures can be formed that are conformal to curvature of a macroform or that can be coiled or wound or stacked and have a robust design. Accordingly a solution is proposed for closely packed structures on metal/plastic foils.

Throughout the application, the term "high-aspect ratio structure" signifies a 3D structure on a substrate having pillars upstanding from a base that is coplanar with a substrate surface, i.e. embedded or outstanding from a substrate's face, the pillars more particularly within 20 degrees relative to normal to the substrate surface and having a height dimension, separated by a base having an interdistance between adjacent pillars, i.e. a length dimension normal to the walls coplanar along the base, wherein the ratio of the height dimension and the length dimension is relatively high, that is, higher than 50, or even higher than 80 or even more than 100. In a typical arrangement, the pillars may have height dimensions, i.e. a height separating a base plane from a planar surface of about 25-200 micrometer, preferably 50-100 micrometer wherein the length dimensions, i.e. the length separating opposing pillars, according to the independent claim has a minimum interdistance larger than 600 nm, and can be in the order of 1-10 micrometer, preferably 2-4 micrometer. For such structures, the substrate as presently disclosed is electrically conductive with a surface area of the current collector that is greatly increased, which enhances the charge collecting capacity of the current collector. Moreover, for such structures, it is possible to apply a conformal coating without compromising the functionality of the multilayer coating. Examples of such functionality may be multilayers such as a battery multilayer or photovoltaic multilayer or single layer coatings. An example of a surface enhancing coating is the provision of a 'hairy' layer, such as a graphite coating, for example, for energy harvesting and storage, such as hydrogen storage. Other examples may include pillars with increased surface roughness by additive or subtractive treatment of the primary pillar structure.

In addition, according to an aspect of the invention, for such high-aspect ratio structures optimal current collecting performance may be provided in the form of a conformally coated pillared metal substrate comprising aluminium or titanium, and wherein the high-aspect ratio structure comprises metal pillars having a radius of curvature larger than 50 nanometer. An aspect of improved performance is a trade-off that is found by a density of the high-aspect ratio structure demanding smaller pitches and the surrounding conformal coating. In this respect, electrode thicknesses in the battery multilayer may be varied and are correlated to match their volumetric storage capacities for Lithium-ions while charging and/or discharging. A known matching relationship is governed by a C-rate number, known in the art. A C-rate is a measure of the rate at which a battery is discharged relative to its maximum capacity. For example the capacity of the electrode layers at a certain C-rate are matched by controlling layer thickness and material composition. A further aspect of these structures is that for a charge collector having a conformal coating, for instance, a battery multilayer or PV multilayer, a minimum gap of e.g. 50 nm can be still be provided between conformally coated high-aspect ratio structures. The gap may be filled with a filler material for instance of a conductive nature (metal, e.g. copper, conductive glue) for example provided by a deposition process (ECD, PVD, CVD).

The filler could be conductive thus helping in current collection can also have adhesive property, which helps in stacking and could be a barrier material to protect the stack against water or oxygen.

Another aspect of the invention is that a 'conformal coating' is a coating that may comprise a plurality of layers that at least conformally coat the pillars of the high-aspect ratio structure.

It is noted that in US2009214956 a structure is proposed wherein electrolyte material is conformal coated onto conducting nanowires and wherein cathode material, in electrical connection with a second conductive material, is interpenetrated between electrolyte-coated nanowires. In contrast, the conformal coating of the present disclosure concerns, inter alia, a conformal multilayer including an electrolyte and providing a minimum gap between adjacent multilayers. In the specification, depending on context, functional layers may not be in direct contact with other functional structures, but may have intermediate layers or structures in between that may enhance functionality. In that respect, the skilled person will understand that where it is described, for example, that the negative electrode layer is 'in contact' with a charge collector, such would be interpreted as 'in electrical contact' not excluding a possible Lithium diffusion barrier layer, current collecting layer, process protection layer etc. enhancing functionality. This similarly counts for electrolyte layers 'in contact' with the negative electrode and positive electrode layers.

The inventors furthermore surprisingly found, for the structures of interest, that a radius of curvature of the high-aspect ratio structures is larger than 200 nanometer to improve the conformal layer quality.

According to another aspect of the invention metal pillars may be formed in high-aspect ratio clusters that are separated by a grid of planar zones. Such structures enhance flexibility and robustness of the high-aspect ratio clusters, which may be substantially planar, while the grid provides a degree of freedom for conformality to macro forms such as casings of automobiles, mobile telephones etc. that are non planar.

These and other aspects of the invention will be discussed in more detail with reference to drawings, wherein like reference numerals refer to like elements. It will be appreciated that the drawings are presented for illustrative purposes and may not be used for limiting the scope of the appended claims.

DETAILED DESCRIPTION OF THE DRAWINGS

Figure 1:
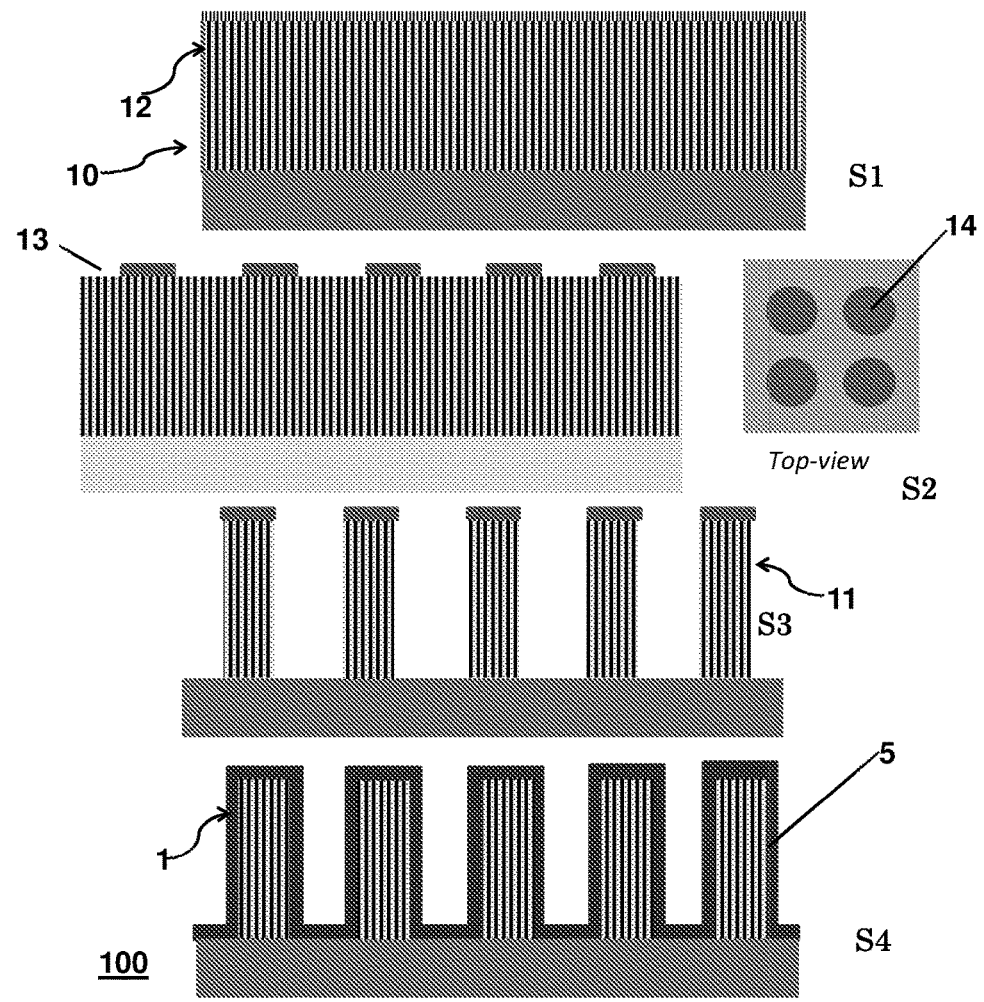
FIG. 1 shows subsequent steps according to a first embodiment.

In FIG. 1 a first embodiment is illustrated of a method according to the present invention. This method starts with guided etching. E.g. nanopores can be etched in doped Si using UV guidance or alternatively, as illustrated in the below, by aligned porous anodization of aluminium foil, which can be optionally preceded with a nano imprinting step to create uniformly spaced indentations on the aluminium surface. The indentations help in controlled ordering of the vertical pores formed during anodization. Instead of an aluminium foil 10, optionally it could be a multilayer foil consisting of an aluminium layer deposited on another metal foil (e.g. copper or steel) or could be applied in laminated form, e.g. on a plastic foil.

More in particular, in a first step S1, by anodization self-aligned nanopores 12 are formed in an aluminium substrate 10, for example 100 µm deep, with a diameter of 80 nm. After anodization, the anodized foil top surface 13 may be covered with a patterned dots mask 14 (e.g photoresist) having the lateral dimensions of the final micropillars desired. The self aligning is an autonomous process wherein self assembly is controlled by an applied voltage or electric current.

Subsequently, in a second step S2 a photolithographic process is carried out of a resist with a microdots mask pattern 14 masking the anodized metal face with a micropattern dots mask arranged to forming pillars 11. For instance, the dot diameter may be 2 µm and a pitch may be 4 µm, e.g, forming pillars with a minimum interdistance between the walls of 2 µm or larger than 600 nm.

In a subsequent step S3 an etching process is carried out of the oxide nanopore structure, for example, by a suitable plasma, vapor HF or wet etching. The etchant will penetrate the oxide pores wherever mask is not present. Although, the etchant will also try underetching below the mask, this can be minimized by controlling the time the unprotected alumina is etched away rapidly. This is known as pore-widening etch in the art and is continued till all of the unmasked pore wall is etched. Then the substrate must be rinsed quickly with water to minimize under etching. The method relies on the notion that the etchant can easily penetrate the unmasked pores and start dissolving everything around quickly before under-etching starts to dominate; thus forming a micropillar structure 100. Accordingly a nanopore pillar structure is provided by guided etching, for example by natural alignment in an anodization process, or may be provided by other guidance processes where nanopores can be etched in doped Si using UV guidance.

Next step S4 will render the pillars thus formed electrically conductive. This may be carried out by stripping the dots masking resist and then plating i.e. electrochemical deposition (ECD), e.g. electroless plating, or sputtering a conductive/metal layer 5 over the upstanding micropillars 1 which will be sufficient to use these structures as current-collecting substrates for 3D batteries.

Figure 2:
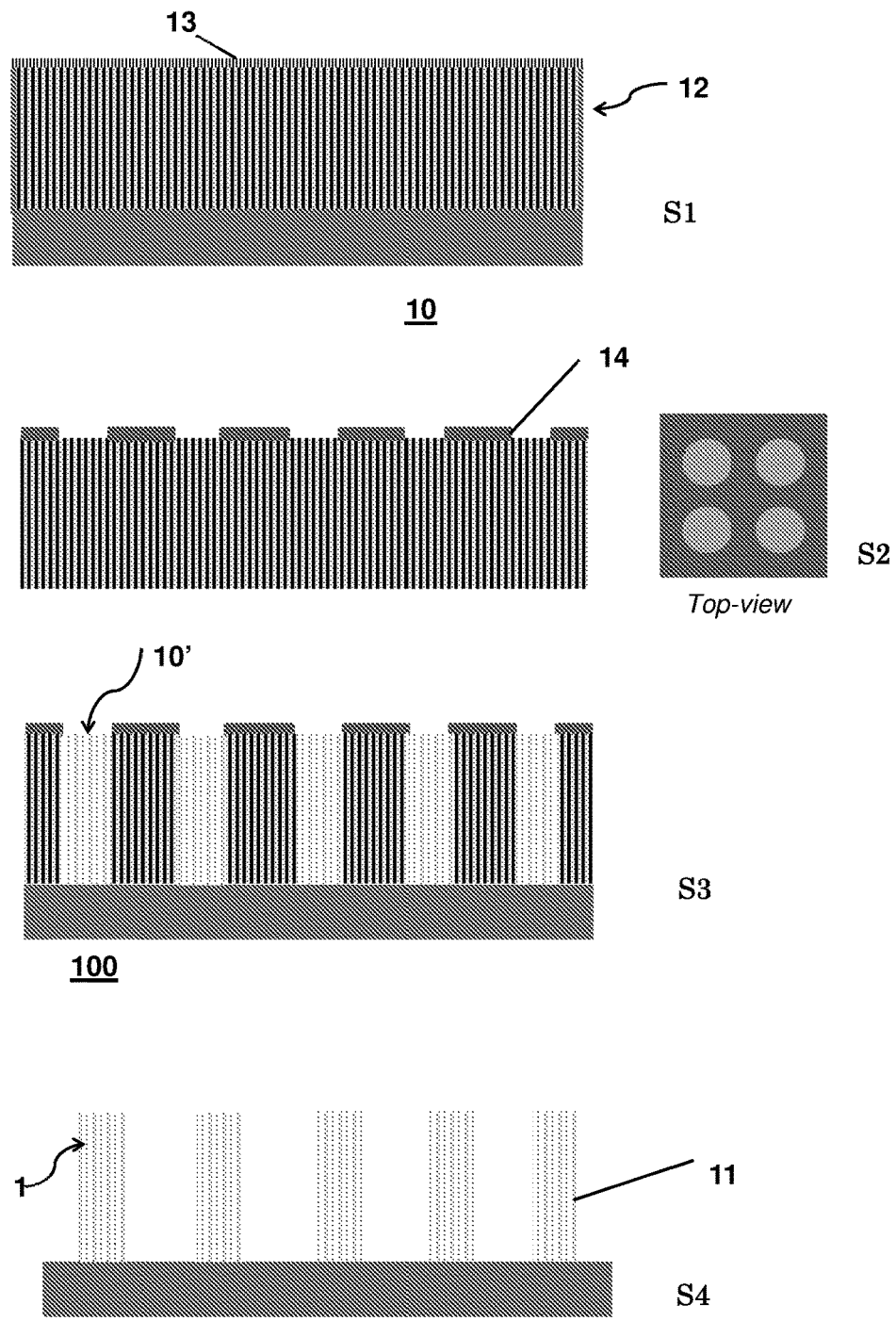
FIG. 2 shows subsequent steps according to a second embodiment.

In another embodiment, illustrated in FIG. 2, likewise a substrate is formed as in steps S1 and S2 described previously. In particular, after anodization, the anodized foil top surface is covered with a patterned holes mask (e.g photoresist) having the lateral dimensions of the final micropillars 1 desired.

Subsequently, in step S3 a selective anisotropic electro-reduction process is disclosed of anodized alumina on a base metal foil optionally in combination with electroplating and electroless plating. That is, the pore walls at the locations where the mask is open are at least partially reduced back to aluminium 10' e.g. by chemical or electrochemical reduction, forming aluminum or aluminum-alumina composite pillars surrounded by remaining masked aluminum oxide. This can be (optionally) combined with an electroplating step to result in solid aluminium or alumina/aluminum pillars or pillars of a composite metal structure, e.g. Cu/Al or Ni/Al structure.

Then, remaining oxide may be etched or stripped in Step S4. The remaining pillars will be porous aluminum pillars. Optionally, the porous aluminium pillars 1 may be further covered with a conductive layer as in FIG. 1 to form hybrid porous aluminium pillars.

Figure 3:
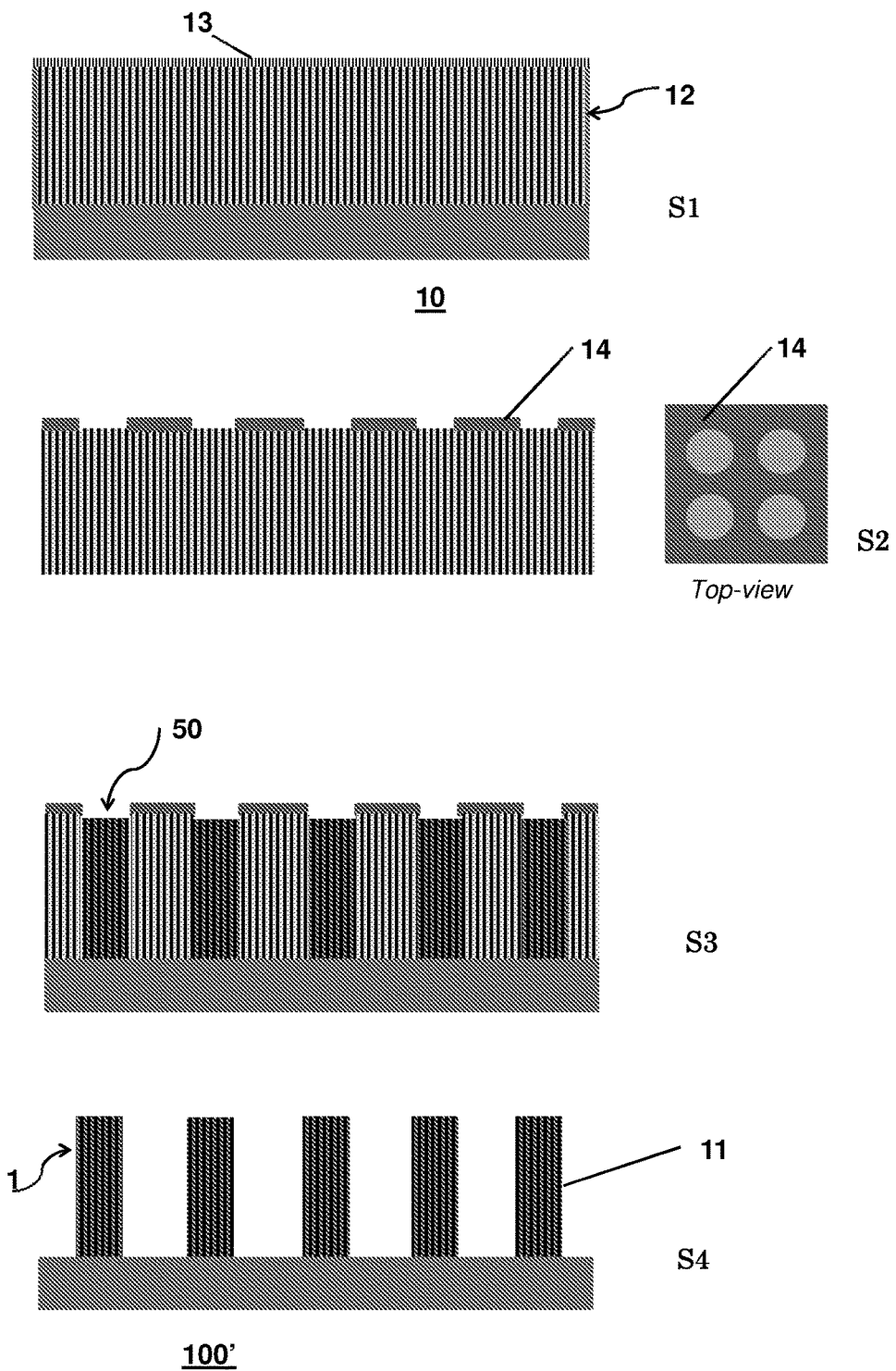
FIG. 3 shows subsequent steps according to a third embodiment.

In another embodiment, illustrated in FIG. 3, likewise a substrate is formed as in steps S1 and S2 described previously. Subsequently, in step S3 a selective plating process is carried out of anodized alumina on a base metal foil. That is, the pores at the locations where the mask is open are filled by plating, for example, with an ionic liquid 50. Alternatively, bottom oxide removal may be carried out and an electroplating process is started from bottom foil.

Then, remaining oxide may be etched or stripped in Step S4. The remaining pillars 1 on device 100' will be plated micropillars formed in porous nanowire structures.

Similar to FIG. 1 an additional metal coating may be applied to render the walls conductive, e.g. by sputtering or electroless plating. The advantage over the structure of FIG. 1 is that the nanowires may be more conductive, so that a thinner coating can be applied.

In the above mentioned processing methods,
the shape of the final micro pillars need not be round (could have any geometric cross-section) and a wide range of pitch as well as arrangement can be chosen.
it can be chosen to do the anodization process on both sides of the foil. Such a two sided anodization could result in balanced volume expansion stress caused during anodizing aluminium to porous alumina.

Formations of conductive pillars may use a template (e.g. anodized alumina or silica). The nanopillars/wires are electrodeposited in these pillars and then the template is removed/dissolved. Preferably the anodized template is micro structured and used as a material for the micropillars of the battery, so that the template is not sacrificial.

While in the following the current collector structures are illustrated in isolated form, the skilled person will understand that they will form integral elements of an electronic device designed to a specific purpose. For example, charge collecting is an essential part of a battery structure or electro-optical devices, for example, a solar cell. For example, in an embodiment of the invention an electronic device having a high-aspect ratio structure can be covered with PhotoVoltaic (PV) multilayers yielding a higher area efficiency of the PV. For example, in another embodiment, the electronic device may have PV multilayers that are deposited on a high-aspect ratio structure already coated with battery multilayers. In another example, the electronic device may have PV multilayers that are deposited on the high-aspect ratio structure which are formed on the opposite face of the substrate already containing battery multilayers. This is an interesting concept that provides a photovoltaic foil device including a battery function, that share a common electrode in the form of the high-aspect ratio structure as presently disclosed.

In their simplest conceptualization, battery devices two electrodes, one that supplies electrons by virtue of an oxidation process occurring at that electrode, termed the anode, and a second one that consumes electrons by virtue of a reduction process occurring at that electrode, termed the cathode. In discharging battery mode, the anode is the "negative electrode" to which the positive current flows, from the cathode, being the "positive electrode". During charge these functions are reversed. Irrespective charging mode, the electrochemical relationship may be characterized by charge exchange between a negative electrode material and a positive electrode material, the negative electrode material having a workfunction or redox potential that is lower than the workfunction or redox potential of the positive electrode material.

For example, known negative electrode (anode during battery discharge) materials are Li4Ti5O12 (Lithium Titanate spinel or LTO); LiC6 (Graphite); Li4.4 Si (Silicon) and Li4.4Ge (Germanium) known positive electrode (cathode) materials are LiCoO2 (Lithium Cobalt oxide or LCO), LiCoPO4, (doped) LiMn2O4 (Lithium manganese oxide spinel or LMO), LiMnPO4, LiFePO4 (LFP), LiFePO4F (LFPF) or LiCO1/3Ni1/3Mn1/3O2 (LCNMO).

Known (solid state) electrolytes might include lithium iodide (LiI), lithium phosphate (Li3PO4) and lithium phosphorus oxynitride (LiPON). In addition, lithium salts, such as LiPF6, LiBF4 or LiClO4 in an organic solvent, such as ethylene carbonate, dimethyl carbonate, diethyl carbonate, propylene carbonate are known to have a typical conductivity of about 10 mS/cm at RT. The solvent decomposes on initial charging and forms a solid layer called the solid electrolyte interphase (SEI).

Thin film ion batteries, including those of the thin film solid state lithium ion type, can be prepared from various deposition techniques to fabricate negative electrode, positive electrode, and electrolyte materials bonded together to form the battery. Such techniques may typically include depositing thin films of such materials using vacuum deposition or other techniques that result in similar thin films, to produce the "thin film" batteries. Thin film batteries are often employed in applications in which space and weight may preferably be conserved and extremely long cycle life may be desired.

In the following examples in more detail aspects of the invention will be illustrated in the form of an electrochemical device, more specifically a battery device, for instance of a lithium ion type, more specifically having a 3D collector structure for enhancing the charge collecting specific area of the collector, that is in electrical contact with battery multilayer, in particular, a negative electrode layer thereof.

Figure 4:
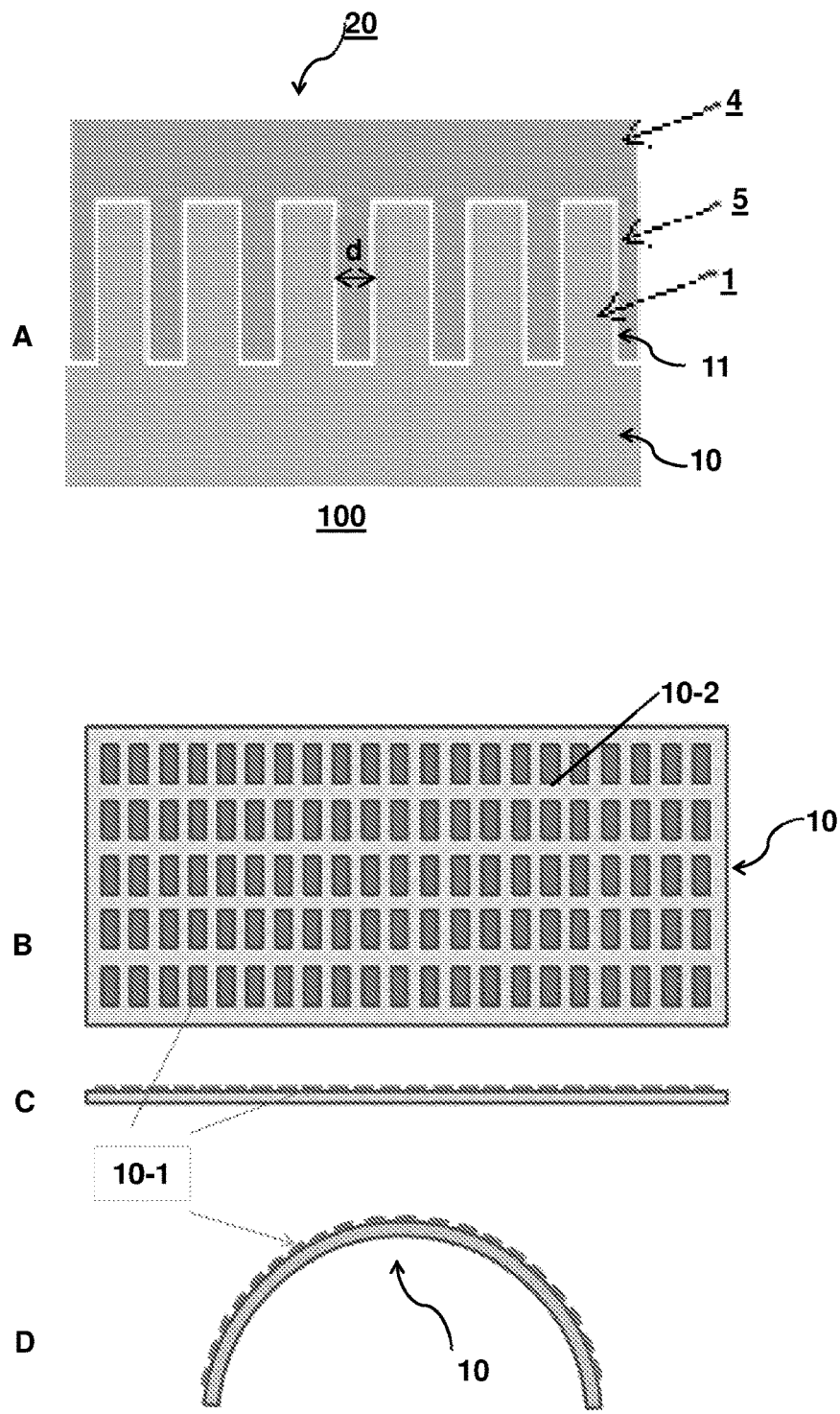
FIG. 4 schematically shows a high-aspect ratio structure according an embodiment of the present invention

FIG. 4 schematically shows a high-aspect ratio structure according to an embodiment of the present invention. In the figure, pillars 1 are formed as a high-aspect ratio structure formed in for example aluminum. Alternatively titanium can be used with similar results. The electronic device 100 comprising an electronic circuit equipped with a current collector 10 formed by a monolithic metal substrate having a face forming a high-aspect ratio structure 1 of pillars 11. The walls have an interdistance d larger than 600 nm and, for example, an aspect ratio larger than 10 or even larger than 50. The aluminium structure is suitable for this since the pillar structures can be provided in anodized aluminium, which have a natural nanopore structure due to ingress of oxide. The nanopores can be masked by a micropattern, so that hybrid porous aluminium micro pillars are formed by adding or removing techniques, notably, etching, plating oxide-reduction or deposition, for example by Electro Chemical Deposition (ECD) or Physical Vapour Deposition (PVD) or Chemical Vapour Depositino (CVD) or Atomic Layer Deposition (ALD) or Chemical Solution Deposition (CSD) technique. In the specification, the term pillars or micropillars is used to distinguish from nanowires, for example of the type described in WO20130226892, which are elongate wires having diameter dimensions smaller than 300, or even smaller than 50 or 10 nm and with interdistances d smaller than about several hundreds nm, e.g. in the range of 50-300 nm, which are too densely packed without sufficient gap for conformally coating multilayer stacks on them.

The pillars may have lengths of more than 100 nm, arbitrary elongate shapes and diameters at least larger than the said 10 nm, typically more than 100 nm and in this respect typically qualify as high-aspect ratio structures.

In US2009214956 a structure is proposed wherein electrolyte material, is conformally coated onto conducting nanowires and wherein cathode material, in electrical connection with a second conductive material, is interpenetrated between electrolyte-coated nanowires. In contrast, the micropillars as presently discloses have interdistances substantially larger, that is larger than 600 nm. The pillars 1 are covered by a multilayer or stack 5 of a suitable composition, further detailed below. Suitably, the collector is planarized by a filler material 4, for example, a conductive glue, or a plated material that is in electrical contact with a cathode of the multilayer to form opposite electrode 20. The compressibility as well as strechability of each of the layers in the device 100, the adhesion between the layers 10, 5 and 20 and the total bending stiffness of the stack will determine the maximum allowed bending radius (without damage) while winding or flexing.

The filling spacer 4 could be any organic or inorganic material. It can for example have some other extra functionality such as a current collector and may optionally, be electroplated over the pillars after the active layers of the battery stack are deposited. Also, the filling can be used as a planarizing filler that planarizes the high-aspect ratio structure 10.

FIG. 4B, C and D in more detail show a top view, side view and flexed form of clustered pillar forms 10-1 to illustrate how the current collector 10 can be wound or flexed. In order to enable easy flexing, instead of having the pillars all over the substrate foil, isolated islands of pillar-clusters 10-1 can be patterned in a metal foil to form an integral part of it. The lower stiffness of the substrate foil at locations with no pillars, i.e. a grid of planar zones 10-2, enables easy bending or rolling of a 3D battery foil 10 for example, as illustrated in FIG. 4D. The high-aspect ratio clusters 10-1 of micropillars can optionally be further stabilized by filling a spacer material between them of the type disclosed in FIG. 4A. In an example, the high-aspect ratio clusters may span an area smaller than 10e4 micrometer2; and the planar zones may be formed as strips having a width larger than 50 micrometer, although other ranges can be suitably used to the same effect of clustering to enable easy flexing.

Figure 5A:
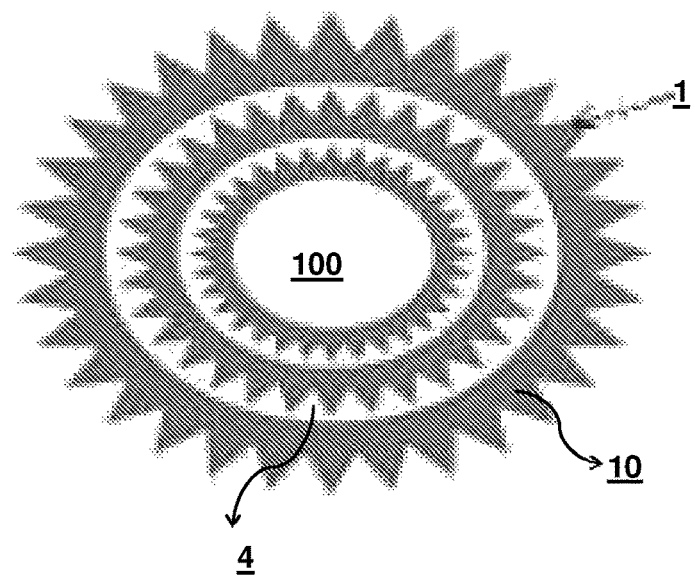
FIG. 5 illustrates aspects of high-aspect ratio structures that are wound or stacked
Figure 5B:
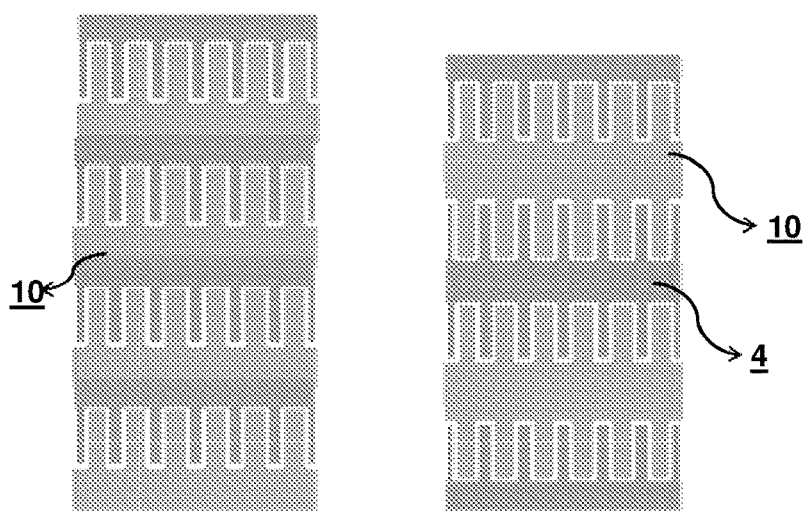

FIG. 5 illustrates how the high-aspect ratio structures can be wound (FIG. 5A) or stacked (FIG. 5B). While winding, to avoid damage to the pillars, the pillars are made to face outwards so that the face forming the high-aspect structure is convex. The wound stack can either be concentric (as shown in the figure) or like a continuous spiral, in the figure, by tapered pillars, cones or pyramids facing outwards. In order to avoid cracking of the active layers due to strains caused while winding, optionally the deposition of (at least some of the) active layers can be done after the winding is done.

Since the possibility of cracking the active layers while bending or winding is the highest in-between the pillars, it can be optionally chosen to deposit the active layers just on the pillars (and not in-between). Moreover, this will additionally also avoid cracking at the base corners around the pillars while volume expansion/contraction of the electrode layers happens during charging/discharging of the battery.

In general, in order to avoid active layers cracking while flexing or while battery operation, corners of the 3D battery structure are to be designed rounder, i.e. with a radius of curvature larger than 200 nm, or even larger than 1 micrometer.

FIG. 5B shows another way of increasing the energy or power density per unit volume of the 3D battery, for example by stacking separate battery foils 10 on top of each other. This stacking in the 3D battery case can be done by using optionally a conductive glue 4 (if the foils are connected in series). This conductive glue 4 could also be a filler material to stabilize the pillars on each of the foils. Accordingly, a plurality of current collectors may be provided, that are alternatingly stacked with battery multilayers.

Optionally, 3D pillars could be created on both sides of the metal foil. In embodiment, this could be combined with a photovoltaic layer on one side and a battery layer on the other side or on the same side. In another embodiment this could be used to provide two battery stack layers per foil 10. In this case, the substrate foil (in case of being a metal), will act as a common electrode while stacked (see FIG. 5b). The connection of different battery foils to each other in a circuit needs to be according to the voltage desired while charging and discharging.

In order to make such batteries cost-effective, it is advantageous to transfer this technology to large area metal foils e.g. for roll-to-roll processing.

Figure 6:
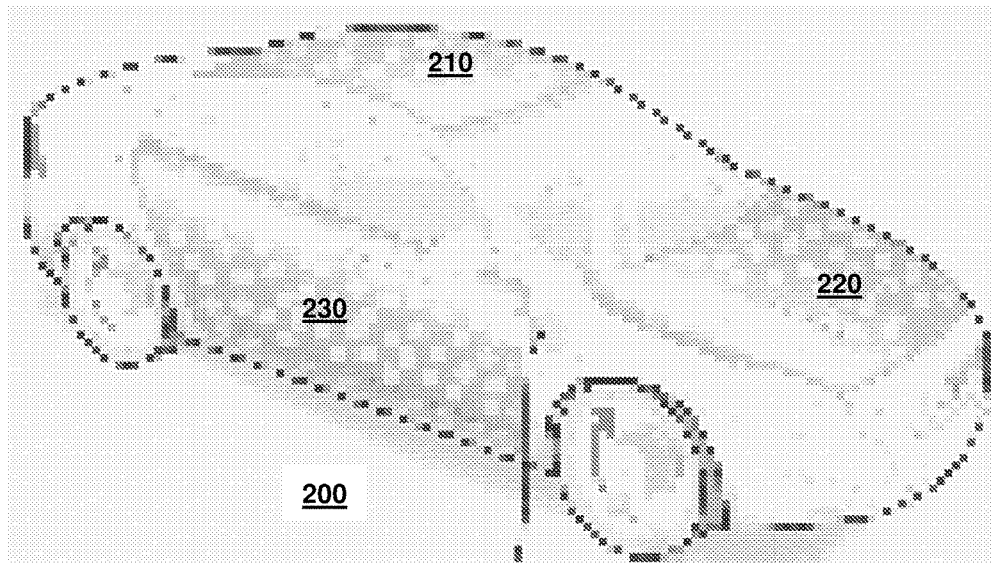
FIG. 6 shows examples of packaging or covers with the high-aspect ratio structures
Figure 6:
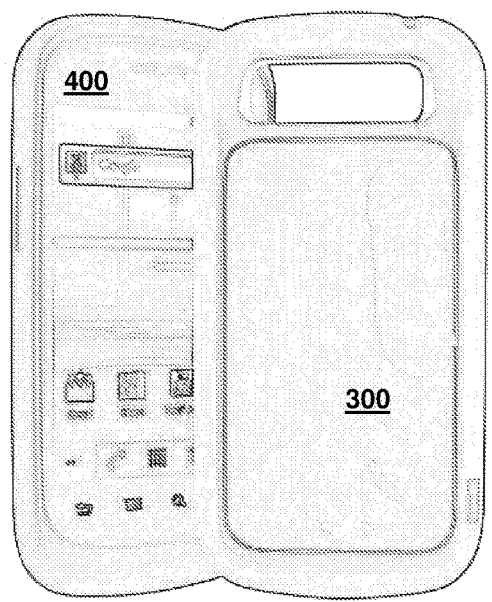

FIG. 6 shows examples of using packaging or covers or frames of devices/machines/equipments as substrates for 3D thin-film batteries. Nowadays, since products are getting compacter, the demand on small and more compact batteries (providing the same power or capacity needed) is growing. The ideas mentioned in this patent intake is about fabricating these 3D micropillar structures on the package or cover of a device that uses these batteries. One of the areas that has been looked into is the integration of batteries into the package/cover of a device. A battery device could be as small as a mobile phone 300 and as big as an electric car 200. For example in a car, aluminium or aluminized covers, such as a side panel 230, roof panel 210, bonnet 220 etc., may be used for providing battery structures on large areas. Or, in a mobile phone 400, an aluminized rear panel 300 having the high-aspect ratio structure as presently disclosed may be forming the battery, or may be provided as a switchable cover for extra power.

The 3D structured substrate could contain pillar structures or aligned porous structures achieved by anodization as the base technology.

For instance, since the 3D battery structures can be formed directly by anodizing the body frame of a car. The material of the frame can be of steel, coated with a layer of Aluminium needed for anodization. Subsequent electroplating and oxide etching steps can create the 3D pillar structures on the car body (preferably interior).

Accordingly the metal substrate having the high-aspect ratio structure may monolithically formed as a casing structure. There are other devices that have covers made of aluminium, where this concept may be applied. Alternatively a metal substrate may be stacked on an organic foil, i.e. containing a hydrocarbon content, for example, PEN, PET etc or plastic mould structure. Even if the packages/covers of most of the devices today are moulded of plastic, still 10s of micrometers of aluminium can be electroless plated by ionic liquids on plastics to create the battery on it or in it.

Figure 7:
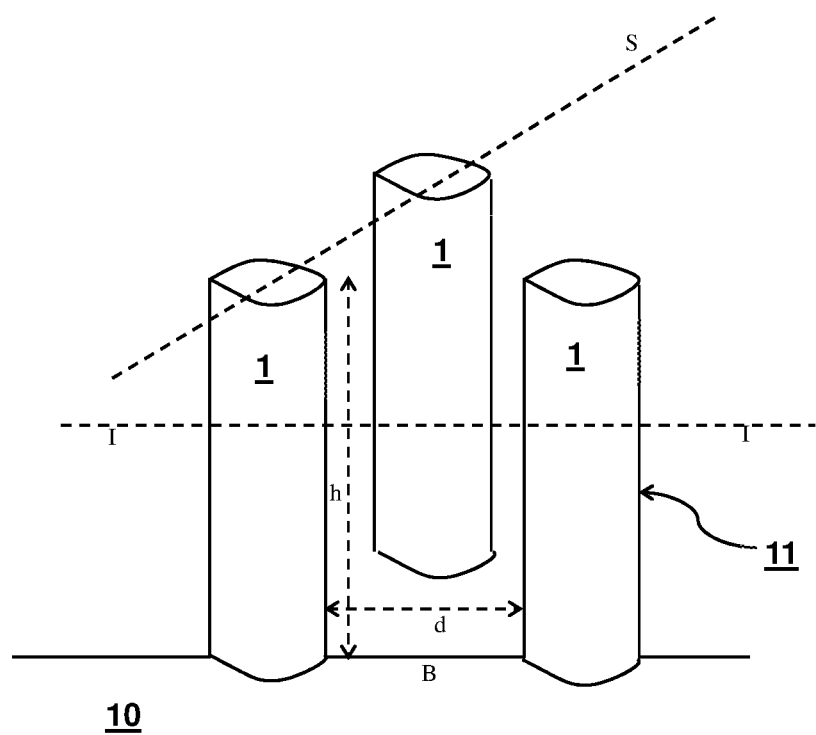
FIG. 7 shows an exemplary perspective schematic of a high-aspect ratio structure in the form of pillars.
Figure 7:
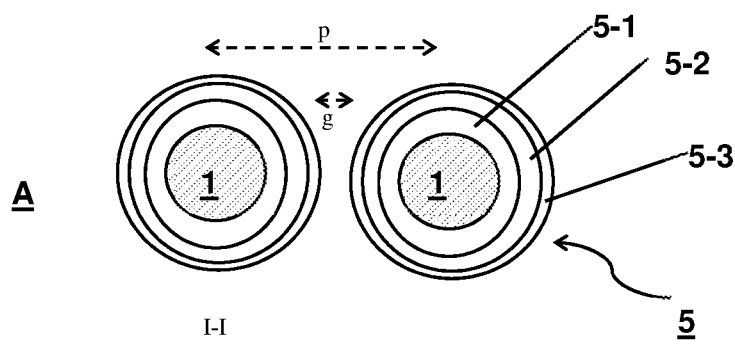

FIG. 7 shows an exemplary perspective schematic of a high-aspect ratio structure in the form of pillars 1 that are covered with a conformal battery multilayer as shown in the 7A, giving a schematic cross-sectional view along I-I. The high-aspect ratio structure disclosed is formed by geometrically ordered micropillars 1 on a substrate 10 having a base b conformal with a surface s but can alternatively be trenches, ridges, tapered structures and forming a planar face s. In the embodiment, the metal pillars 1 have pillars 11 with a radius of curvature larger than 50 nanometer. A minimum interdistance d is larger than 600 nm to accommodate a conformal coating of about 300 nm thickness. A practical interdistance may be about 2-3 micron. The metal pillars may have a height h as high as 25 micrometer or higher, for example, 50 or 100 micrometer and can be formed with a pitch p in the range of 3-12 micrometer. Gaps g between pillars 1 are preferably filled, in particular, after depositing the active multilayer 5 of the battery stack with cushion or spacer material 4 to avoid contact between them while bending or flexing the 3D battery stack. A gap between adjacent conformal battery coatings 5 may be in the order of 100-500 nanometer. The gap may be completely filled with a conductive material.

In the example, preferably, the battery multilayer 5 comprises a solid state electrolyte layer 5-2 interposed between a negative electrode layer 5-1 in electrical contact with the pillar 1 and a positive electrode layer 5-3. It is found that the battery multilayer preferably comprises a first electrode 5-1 layer coated on the high-aspect ratio structure and having a thickness that matches, for a given C-rate, the effective volumetric storage capacity of second electrode layer 5-3 that is separated from the first electrode layer by an electrolyte layer 5-2. In this way electrode thicknesses in the battery multilayer may be varied and are correlated to match their effective volumetric storage for a given C-rate capacities for Lithium-ions while charging and/or discharging, while at the same time, due to curvature, the manufacturability is enhanced. The thickness of the negative electrode layer can be typically less than the positive electrode layer due to a higher theoretical density. For $LixTiO_2$ and or $LixMnO_2$ the densities and thicknesses are similar. For example, the first layer 5-1 may be the negative electrode layer ranging between 80 and 300 nm; and the second layer 5-2 may be an electrolyte layer ranging between 60 and 200 nm. The positive electrode layer, 5-3 may range between 30 and 200 nm. The battery stack could be integrated into any other device (e.g. PV) substrate, which can then be further integrated into other structures.

Instead of a battery layer that is formed conformally to the high-aspect ratio structure, such structure may be used as a charge collector structure when combined with a negative electrode layer that is formed to planarize the high-aspect structure—i.e. not a conformal layer. For instance such negative electrode layer could be in contact with an electrolyte of solid state type but alternatively could be in a liquid form.

Aspects of the present invention are characterized by the following clauses:

An electronic device comprising an electronic circuit equipped with a current collector formed by a metal substrate having face forming a high-aspect ratio structure of pillars, the walls having a minimum interdistance larger than 600 nm.

An electronic device as before, wherein the high-aspect ratio structure is formed by trenches or geometrically ordered micropillars.

An electronic device as before, wherein the metal substrate comprises aluminium or titanium, and wherein the high-aspect ratio structure comprises pillars having a radius of curvature larger than 50 nanometer.

An electronic device as before, wherein the pillars are higher than 25 micrometer.

An electronic device as before, wherein the pillars are formed in high-aspect ratio clusters that are separated by a grid of planar zones.

An electronic device as before, wherein the high-aspect ratio clusters span an area smaller than 10e4 micrometer2; and wherein the planar zones are formed as strips having a width larger than 50 micrometer.

An electronic device as before, wherein the face forming the high-aspect structure is convex.

An electronic device as before, wherein the substrate is a foil having both faces forming a high-aspect ratio structure.

An electronic device as before, wherein the high-aspect ratio structure and the metal substrate are formed monolithically.

An electronic device as before, wherein the high-aspect ratio structure is covered with a coating that is conformal to the pillars of the high-aspect ratio structure.

An electronic device as before, wherein the coating is a battery multilayer or a PV multilayer or both.

An electronic device as before, wherein the battery multilayer comprises a solid state electrolyte layer.

An electronic device as before, wherein the battery multilayer comprises a first electrode layer coated on the high-aspect ratio structure and having a thickness that matches the effective volumetric storage capacity of a second electrode layer at a battery charging rate larger than 10 C-rate.

An electronic device as before, wherein the first layer is an negative electrode layer ranging between 80 and 300 nm; wherein the second layer is an electrolyte layer ranging between 60 and 200 nm; and wherein a positive electrode layer ranges between 30 and 200 nm.

An electronic device as before, having a plurality of current collectors, that are alternatingly stacked.

An electronic device as before, wherein the multilayer structure is covered with a planarizing filler that planarizes the high-aspect structure.

An electronic device as before, wherein the filler is a metal forming an electrode part.

An electronic device as before, wherein the filler is a conductive glue that functions to stack the current collector and while stabilizing the high-aspect structure.

An electronic device as before, wherein the metal substrate is stacked on an organic foil.

An electronic device as before, wherein the metal substrate is monolithically formed as a casing structure. The claimed battery stack could be integrated into any other device (e.g. PV) substrate, which can then be further integrated into other structures.

It will be appreciated that while specific embodiments of the invention have been described above, that the invention may be practiced otherwise than as described. In addition, isolated features discussed with reference to different figures may be combined.

The invention claimed is:

1. A method of manufacturing a current collector with a high-aspect ratio structure of pillars formed in a metal substrate, wherein the method comprises: monolithically forming elongate and aligned nanopore structures on a face of the metal substrate; masking the nanopore structures with a micro-pattern mask arranged to forming the nanopore structured pillars having a minimum interdistance larger than 600 nm; and rendering the pillars electrically conductive; wherein the high-aspect ratio structure is formed by removing nanopore material in the micro-pattern thus forming nanopore micropillar structures.

2. A method according to claim 1, wherein prior to removing nanopore material, the high-aspect ratio pillar structure is rendered electrically conductive by plating unmasked nanopore structures in a hole pattern thus forming plated nanopore pillar structures.

3. A method according to claim 2, wherein the plating is electro-less or by electroplating.

4. A method according to claim 1, wherein the high-aspect ratio pillar structure is formed by removing unmasked nanopore material in a dot pattern thus forming masked nanopore pillar structures having upstanding walls, and wherein the pillars are rendered electrically conductive by covering the pillar walls with a conductive layer.

5. A method according to claim 4, wherein the covering is performed by Electro Chemical Deposition (ECD) or PVD or CVD or ALD, CSD.

6. A method according to claim 4 wherein the pillars are rendered electrically conductive by electro-reducing the unmasked nano-pore structure.

7. A method according to claim 1, wherein the metal substrate is aluminium or titanium.

8. A method according to claim 1, wherein the pillars are covered with subsequent layers to form a coating that is conformal to the pillars.

9. A method according to claim 8, wherein the coating is a battery multilayer or a photovoltaic multilayer.

10. A method according to claim 9 wherein the multilayer comprises a solid state electrolyte layer.

11. A method according to claim 9, further comprising covering the multilayer structure with a planarizing filler that planarizes the high-aspect ratio structure.

12. A method according to claim 1, wherein the metal substrate is stacked on an organic foil.

13. A method according to claim 1, wherein the current collector is manufactured in a roll-to-roll process.

14. An electronic device comprising a current collector having a high-aspect ratio structure of pillars formed in a metal substrate, monolithically formed of elongate and aligned nanopore pillar structures on a face of the metal substrate; and having a minimum interdistance larger than 600 nm; said nanopore pillars being electrically conductive.

15. An electronic device according to claim 14 wherein the metal substrate comprises aluminium or titanium, and wherein the high-aspect ratio structure comprises pillars having a radius of curvature larger than 50 nanometer.

16. An electronic device according to claim 15, wherein the pillars are higher than 10 micrometer.

17. An electronic device according to claim 14, wherein the pillars are formed in high-aspect ratio clusters that are separated by a grid of planar zones.

18. An electronic device according claim 14, wherein the substrate is a metal foil having both faces forming a high-aspect ratio structure.

19. An electronic device according to claim 14, wherein the high-aspect ratio structure is covered with a coating that is conformal to the pillars of the high-aspect ratio structure; wherein a gap is provided between conformally coated high-aspect ratio structures.

20. An electronic device according to claim 19, wherein the coating is a battery multilayer or a photovoltaic multilayer or both.

* * * * *